US011464303B2

(12) United States Patent
Derrig

(10) Patent No.: US 11,464,303 B2
(45) Date of Patent: Oct. 11, 2022

(54) BLACK DIAMOND LIKE CARBON (DLC) COATED ARTICLES AND METHODS OF MAKING THE SAME

(71) Applicant: Frederick Goldman, Inc., New York, NY (US)

(72) Inventor: Andrew Derrig, Lynbrook, NY (US)

(73) Assignee: Frederick Goldman, Inc., New York, NY (US)

(*) Notice: Subject to any disclaimer, the term of this patent is extended or adjusted under 35 U.S.C. 154(b) by 100 days.

(21) Appl. No.: 16/739,391

(22) Filed: Jan. 10, 2020

(65) Prior Publication Data

US 2020/0224318 A1 Jul. 16, 2020

Related U.S. Application Data

(60) Provisional application No. 62/791,456, filed on Jan. 11, 2019.

(51) Int. Cl.
*A44C 27/00* (2006.01)
*C23C 28/00* (2006.01)
(Continued)

(52) U.S. Cl.
CPC .......... *A44C 27/006* (2013.01); *A44B 15/005* (2013.01); *A44C 5/00* (2013.01);
(Continued)

(58) Field of Classification Search
CPC ... A44C 27/005; A44C 27/006; A44C 27/007; C23C 28/30; C23C 28/32; C23C 28/341
(Continued)

(56) References Cited

U.S. PATENT DOCUMENTS 5,882,786 A 3/1999 Nassau et al.
7,749,564 B2 7/2010 Feng et al.
(Continued)

FOREIGN PATENT DOCUMENTS

CN 105102674 B 7/2018
EP 1698713 A1 9/2006
(Continued)

OTHER PUBLICATIONS

Adams, Back to black: Jewellery turns to the dark side, accessed on internet https://howtospendit.ft.com/watches-jewellery/202898-back-to-black-jewellery-turns-to-the-dark-side, Financial Times, Mar. 2018 (11 pages).
(Continued)

*Primary Examiner* — Archene A Turner
(74) *Attorney, Agent, or Firm* — Dentons US LLP

(57) ABSTRACT

A device comprising: a substrate; a first coating deposited on the substrate; an intermediate coating deposited on the first coating, wherein the first coating is interposed between the substrate and the intermediate coating; and a second coating deposited on the intermediate coating, wherein the intermediate coating is interposed between the first coating and the second coating, and the second coating is outermost and black. The substrate, the first coating, the intermediate coating and the second coating define at least one of a jewelry item and a component of a jewelry item.

43 Claims, 2 Drawing Sheets

(51) Int. Cl.
| | |
|---|---|
| *C23C 14/00* | (2006.01) |
| *C23C 16/00* | (2006.01) |
| *C23C 28/04* | (2006.01) |
| *A44C 5/00* | (2006.01) |
| *A44C 9/00* | (2006.01) |
| *A44B 15/00* | (2006.01) |

(52) U.S. Cl.
CPC ............. *A44C 9/00* (2013.01); *A44C 27/005* (2013.01); *A44C 27/007* (2013.01); *C23C 14/00* (2013.01); *C23C 16/00* (2013.01); *C23C 28/04* (2013.01); *C23C 28/30* (2013.01); *C23C 28/32* (2013.01); *C23C 28/321* (2013.01); *C23C 28/322* (2013.01); *C23C 28/341* (2013.01); *C23C 28/343* (2013.01); *C23C 28/36* (2013.01); *Y10T 428/12576* (2015.01); *Y10T 428/31678* (2015.04)

(58) Field of Classification Search
USPC .......................................................... 428/408
See application file for complete search history.

(56) References Cited

U.S. PATENT DOCUMENTS

| | | | |
|---|---|---|---|
| 2003/0060302 A1 | 3/2003 | Rogers et al. | |
| 2005/0166401 A1 | 8/2005 | Robert | |
| 2007/0082229 A1 | 4/2007 | Mirchandani et al. | |
| 2010/0247907 A1 | 9/2010 | Tacken et al. | |
| 2016/0053371 A1* | 2/2016 | Tanaka | C23C 16/26 428/408 |
| 2020/0071838 A1† | 3/2020 | Tryon | |
| 2020/0081402 A1† | 3/2020 | Tsukamoto | |
| 2020/0224318 A1† | 7/2020 | Derrig | |

FOREIGN PATENT DOCUMENTS

| | | |
|---|---|---|
| JP | S6136199 C | 2/1986 |
| JP | 2580692 B2 | 2/1997 |
| JP | 2003230411 A | 8/2003 |
| JP | 2005272901 A | 10/2005 |
| JP | 4067434 B2 | 3/2008 |
| JP | 4072950 B2 | 4/2008 |
| JP | 2010084233 A | 4/2010 |
| JP | 4504059 B2 | 7/2010 |
| JP | 2010228307 A | 10/2010 |
| JP | 4589772 B2 | 12/2010 |
| JP | 4764104 B2 | 8/2011 |
| JP | 4824328 B2 | 11/2011 |
| WO | WO1996039943 A1 | 12/1996 |
| WO | WO2003056966 A1 | 7/2003 |

OTHER PUBLICATIONS

Argor-Aljba, DLC Coatings, accessed on Internet Nov. 2018, http://www.argor-aliba.com/en/tecnology/dlc-coating/, (4 pages).
Intellectual Alliance, DLC—Black diamond crystal for watches, rings and jewellery, accessed on internet Nov. 2018, http://www.dlc-coating.ca/pdfs/IAI_jewellery.pdf (1 page).
S.V. Hainsworth, et al., Diamond-Like Carbon Coatings for Tribology: Production Techniques, Characterization Methods and Applications, International Materials Reviews, 2007; 52(3):153-174.†

* cited by examiner
† cited by third party

FIG. 1A - RELATED ART
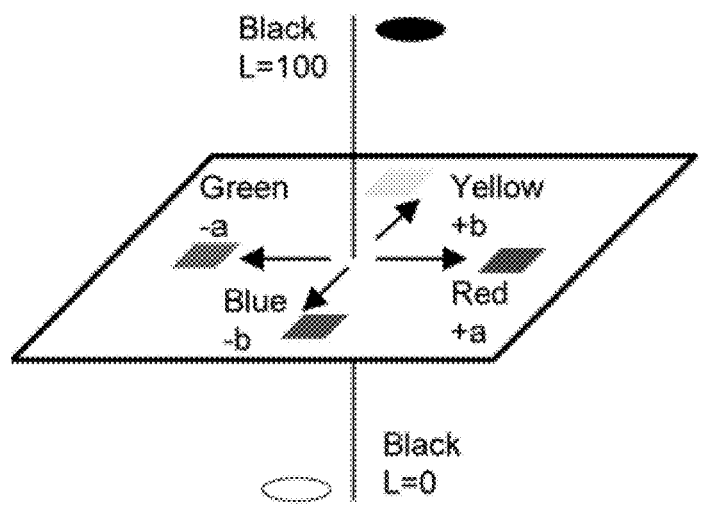
FIG. 1B - RELATED ART

US 11,464,303 B2

BLACK DIAMOND LIKE CARBON (DLC) COATED ARTICLES AND METHODS OF MAKING THE SAME

CROSS REFERENCE TO RELATED APPLICATIONS

The present application claims the benefit of U.S. Provisional Application Ser. No. 62/791,456 filed 11 Jan. 2019, which is incorporated herein by reference in its entirety.

TECHNICAL FIELD

The present application is generally directed to articles having a black coating that is wear-resistant and maintains its strength and luster over an extended period, and methods of preparing the same

BACKGROUND OF THE INVENTION

Traditional metallic surfaces having a black coating have a limited life, and show signs of wear and spalling early in the life of the product. FIGS. 1A and 1B are Minolta color spectrometer readings for traditional black PVD, and a visual representation of the LAB CIE color scale, respectively, where a indicates a transition from green to red, b indicates a transition from blue to yellow, and L indicates the presence of light.

There is need in the consumer goods market for high wear resistance black coating on metallic surfaces that can withstand wear and tear of daily use, while also maintaining an appealing, deep black color and luster, for extended periods of time. Such an ability to withstand wear and tear, and fade-resistance, is not seen with traditional physical vapor deposition (PVD) processes for depositing black coatings, such as tungsten carbide or titanium carbide coatings or black ruthenium galvanic plating.

Plating is a process where a thin layer or coating of a material is deposited on the surface of a substrate. Plating is desirable for various reasons, including for decoration, to harden, to alter conductivity, to inhibit corrosion, to reduce friction, to improve paint adhesion, to improve solderability, to improve wearability, and for radiation shielding. In jewelry, gemstones can also be plated to provide improved color characteristics. See, e.g., U.S. Pat. No. 5,853,826.

Processes used in plating include electroplating, physical vapor deposition (PVD) and chemical vapor deposition (CVD). In electroplating, an electrical current is used to reduce cations of a coating material from a solution to coat a conductive substrate with a thin layer of the material. In PVD, a vaporized form of the coating metal is condensed in a vacuum onto the substrate surface. Vaporization and deposition of the coating metal can be effected by a number of methods known in the art, including evaporative deposition, electron beam physical vapor deposition, sputter deposition, cathodic arc deposition, pulsed laser deposition, and plasma-spray deposition. CVD involves exposing the substrate to a volatile precursor of the coating metal, which reacts or decomposes on the substrate surface.

While electroplating is the simplest process of plating a metal, electroplating is difficult or impossible where the substrate is a refractory metal such as tungsten, molybdenum, niobium, tantalum or rhenium. In particular, tungsten and tungsten alloys, such as tungsten carbide, cannot be electroplated. Thus, tungsten or tungsten alloy articles, such as an article of jewelry, cannot be directly electroplated with, e.g., a layer of a precious metal such as gold, platinum or rhodium. This makes production of plated articles of a tungsten or tungsten alloy substrate difficult to produce.

SUMMARY

This application provides an object that includes a wear-resistant black, or other colored, coating, or a black, or other colored, coating that maintains its strength and luster over an extended period, or such a coating can be provided for an object, including without limitation, a jewelry item, a tool, a medical device, an implant, or a watch case, by including a thin first layer of elemental chromium (Cr), molybdenum (Mo), tungsten (W), seaborgium (Sg), titanium (Ti), vanadium (V), manganese (Mn), iron (Fe), cobalt (Co), nickel (Ni), copper (Cu), zirconium (Zr), niobium (Nb), technicium (Tc), ruthenium (Ru), rhodium (Rh), palladium (Pd), silver (Ag), mercury (Hg), tantalum (Ta), rhenium (Re), osmium (Os), iridium (Ir), platinum (Pt), gold (Au), rutherfordium (Rf), dubnium (Db), bohrium (Bh) or hassium (Hs), and the like. Such a coating also provides adhesive properties.

An exemplary embodiment of this application is directed to a device comprising: a substrate; a first coating deposited on the substrate; an intermediate coating deposited on the first coating, wherein the first coating is interposed between the substrate and the intermediate coating; a second coating deposited on the intermediate coating, wherein the intermediate coating is interposed between the first coating and the second coating, and the second coating is outermost.

The substrate, the first coating, the intermediate coating and the second coating define at least one of a jewelry item and a component of a jewelry item.

The substrate comprises at least one of tungsten carbide, cobalt, tungsten, titanium, titanium carbide, zirconium, zirconium carbide, tantalum, tantalum carbide, rhodium, gold, silver, platinum, palladium, iridium, iron, stainless steel, austenitic general purpose stainless steel (Type 102), austenitic chromium-nickel-manganese alloys (200 Series stainless steel), austenitic chromium-nickel alloys (300 Series stainless steel), ferritic and martensitic chromium alloys (400 Series stainless steel), heat-resisting chromium alloys (500 Series stainless steel), cobalt chrome, cobalt chromium, nickel, nitinol, aluminum, aluminum carbide, vanadium, ruthenium, copper, tungsten copper, brass, bronze, zinc, tin, German silver, niobium, molybdenum, molybdenum carbide, rhenium, hafnium, hafnium carbide, vanadium, vanadium carbide, chromium, chromium carbide, niobium, niobium carbide, a combination comprising at least one thereof, and an alloy comprising at least one thereof.

The first coating comprises at least one of chromium (Cr), molybdenum (Mo), tungsten (W), seaborgium (Sg), titanium (Ti), vanadium (V), manganese (Mn), iron (Fe), cobalt (Co), nickel (Ni), copper (Cu), zirconium (Zr), niobium (Nb), technicium (Tc), ruthenium (Ru), rhodium (Rh), palladium (Pd), silver (Ag), mercury (Hg), tantalum (Ta), rhenium (Re), osmium (Os), iridium (Ir), platinum (Pt), gold (Au), rutherfordium (Rf), dubnium (Db), bohrium (Bh) or hassium (Hs), a combination comprising at least one thereof, or an alloy comprising at least one thereof, or any combination of the foregoing.

The intermediate coating comprises at least one of chromium carbide ($Cr_3C_2$), zirconium nitride (ZrN), chromium-titanium nitride (CrTiN), titanium-aluminum nitride (TiAlN), aluminum-titanium nitride (AlTiN), aluminum oxinitride (AlNO), aluminum-titanium-chromium nitride (AlTiCrN), tungsten nitride (WN), tungsten carbide (WC), titanium diboride ($TiB_2$), aluminum oxide (AlO), Boron carbide (BC), boron nitride (BN), silicon carbide (SiC), silicon nitride (SiN), tungsten (W), zirconium (Zr), cobalt chrome, cobalt chromium, nitinol, aluminum (Al), aluminum carbide, vanadium (V), copper (Cu), brass, bronze, tungsten copper, zinc (Zn), tin (Sn), German silver, niobium (Nb), molybdenum (Mo), hafnium (Hf), rhenium (Re), chromium (Cr), a steel alloy, silver nitride, aluminum nitride, vanadium nitride, tantalum nitride, chromium carbide, zirconium carbide, tantalum carbide, cobalt chrome molybdenum, a combination comprising at least one thereof, an alloy comprising at least one thereof, or a combination of any of the foregoing.

The second coating comprises at least one of diamond like carbon (DLC), titanium-carbo-nitride (TiCN), aluminum-titanium nitride (AlTiN), aluminum-titanium-silicon nitride (AlTiSiN), aluminum-chromium-silicon nitride (AlCrSiN), titanium-aluminum-chromium-silicon nitride (TiAlCrSiN), titanium aluminum nitride (TiAlN), aluminum oxi-nitride (AlNO), aluminum-titanium-silicon nitride nitride (AlTiCrN), titanium carbide (TiC), tantalum carbide (TaC), hafnium carbide (HfC), tungsten carbide (WC), a combination comprising at least one thereof, an alloy comprising at least one thereof, or any combination of the foregoing.

In some embodiments, there is an additional outermost coating deposited on the second coating. In some embodiments, the additional outer coating comprises at least one of aluminum oxide ($Al_2O_3$), silicon dioxide ($SiO_2$), silicon nitride ($Si_3N_2$), $Si_3O_x$, silicon carbide (SiC), tantalum oxide ($Ta_2O_5$), titanium oxide ($TiO_2$), niobium oxide ($Nb_2O_5$), zirconium oxide ($ZrO_2$), yttrium oxide ($Y_2O_3$), hafnium oxide ($HfO_2$), aluminum zirconium oxide (AZO), indium titanium oxide (ITO), aluminum (Al), silicon (Si), tantalum, niobium, zirconium, yttrium, hafnium, aluminum-zirconium-oxide (AlZrO), silicon-indium-oxide.

In some embodiments, the second coating is black.

In some embodiments, the second coating is diamond like carbon.

In some embodiments, the thickness of the second coating is 0.01 μm to 60 μm. In some embodiments, the second coating has a thickness of about 0.01 μm, about 0.02 μm, about 0.03 μm, about 0.04 μm, about 0.05 μm, about 0.06 μm, about 0.07 μm, about 0.08 μm, about 0.09, about 0.1 μm, about 0.2 μm, about 0.3 μm, about 0.4 μm, about 0.5 μm, about 0.6 μm, about 0.7 μm, about 0.8 μm, about 0.9 μm, about 1 μm, about 2 μm, about 3 μm, about 4 μm, about 5 μm, about 6 μm, about 7 μm, about 8 μm, about 9 μm, about 10 μm, about 15 μm, about 20 μm, about 25 μm, about 30 μm, about 35 μm, about 40 μm, about 45 μm, about 50 μm, about 55 μm, about 60 μm, or any thickness between about 0.01 μm and about 60 μm. In some embodiments, the thickness of the second coating is from about 0.01 μm to about 3.0 μm, or any thickness therebetween. In some embodiments, the thickness of the second coating is about 1.7 μm. In some embodiments, a thickness of the second coating is about 55.5 μm. In some embodiments, the first coating is chromium.

In some embodiments, the thickness of the first coating is from about 0.01 μm to about 3.0 μm. In some embodiments, the first coating has a thickness of about 0.01 μm, about 0.02 μm, about 0.03 μm, about 0.04 μm, about 0.05 μm, about 0.06 μm, about 0.07 μm, about 0.08 μm, about 0.09 μm, about 0.10 μm, about 0.15 μm, about 0.2 μm, about 0.25 μm, about 0.3 μm, about 0.35 μm, about 0.4 μm, about 0.45 μm, about 0.5 μm, about 0.55 μm, about 0.6 μm, about 0.65 μm, about 0.7 μm, about 0.75 μm, about 0.8 μm, about 0.85 μm, about 0.9 μm, about 0.95 μm, about 1.0 μm, about 1.1 μm, about 1.2 μm, about 1.3 μm, about 1.4 μm, about 1.5 μm, about 1.6 μm, about 1.7 μm, about 1.8 μm, about 1.9 μm, about 2.0 μm, about 2.1 μm, about 2.2 μm, about 2.3 μm, about 2.4 μm, about 2.5 μm, about 2.6 μm, about 2.7 μm, about 2.8 μm, about 2.9 μm, about 3.0 μm, or any thickness between about 0.01 μm and about 3.0 μm. In some embodiments, the thickness of the first coating is about 0.05 μm. In some embodiments, the thickness of the first coating is about 1.6 μm.

In some embodiments, the intermediate coating is chromium carbide.

In some embodiments, the thickness of the intermediate coating is from about 0.01 μm to about 30 μm. In some embodiments, the intermediate coating has a thickness of about 0.01 μm, about 0.02 μm, about 0.03 μm, about 0.04 μm, about 0.05 μm, about 0.06 μm, about 0.07 μm, about 0.08 μm, about 0.09 μm, about 0.10 μm, about 0.15 μm, about 0.2 μm, about 0.25 μm, about 0.3 μm, about 0.35 μm, about 0.4 μm, about 0.45 μm, about 0.5 μm, about 0.55 μm, about 0.6 μm, about 0.65 μm, about 0.7 μm, about 0.75 μm, about 0.8 μm, about 0.85 μm, about 0.9 μm, about 0.95 μm, about 1.0 μm, about 2.0 μm, about 3.0 μm, about 4.0 μm, about 5.0 μm, about 6.0 μm, about 7.0 μm, about 8.0 μm, about 9.0 μm, about 10.0 μm, about 15 μm, about 20 μm, about 25 μm, about 30 μm, or any thickness between about 0.01 μm and about 30.0 μm. In some embodiments, the thickness of the second coating is from about 0.01 μm to about 3.0 μm, or any thickness therebetween. In some embodiments, the thickness of the intermediate coating is about 0.7 μm. In some embodiments, the thickness of the intermediate coating is 22.9 μm.

In some embodiments, a total thickness of the first coating, the intermediate coating, and the second coating is from about 0.01 μm to about 80 μm. In some embodiments, the total thickness of the first coating, the intermediate coating, and the second coating is about 0.01 μm, about 0.02 μm, about 0.03 μm, about 0.04 μm, about 0.05 μm, about 0.06 μm, about 0.07 μm, about 0.08 μm, about 0.09, about 0.1 μm, about 0.2 μm, about 0.3 μm, about 0.4 μm, about 0.5 μm, about 0.6 μm, about 0.7 μm, about 0.8 μm, about 0.9 μm, about 1 μm, about 2 μm, about 3 μm, about 4 μm, about 5 μm, about 6 μm, about 7 μm, about 8 μm, about 9 μm, about 10 μm, about 15 μm, about 20 μm, about 25 μm, about 30 μm, about 35 μm, about 40 μm, about 45 μm, about 50 μm, about 55 μm, about 60 μm, about 65 μm, about 70 μm, about 75 μm, about 80 μm, or any thickness between about 0.01 μm and about 80 μm. In some embodiments, the total thickness of the first coating, the intermediate coating and the second coating is about 2.45 μm. In some embodiments, the total thickness of the first coating, the intermediate coating and the second coating is about 80 μm.

In some embodiments, the second coating has a hardness of about 2000 to about 2800 HV. In some embodiments, the hardness of the second coating is about 2000 HV, about 2050 HV, about 2100 HV, about 2150 HV, about 2200 HV, about 2250 HV, about 2300 HV, about 2350 HV, about 2400 HV, about 2450 HV, about 2500 HV, about 2550 HV, about 2600 HV, about 2650 HV, about 2700 HV, about 2750 HV, or about 2800 HV, or any amount in between. In some embodiments, the second coating has a hardness of about 2000 HV.

In some embodiments, the intermediate coating has a hardness of about 2000 to about 2800 HV. In some embodiments, the hardness of the intermediate coating is about 2000 HV, about 2050 HV, about 2100 HV, about 2150 HV, about 2200 HV, about 2250 HV, about 2300 HV, about 2350 HV, about 2400 HV, about 2450 HV, about 2500 HV, about 2550 HV, about 2600 HV, about 2650 HV, about 2700 HV, about 2750 HV, or about 2800 HV, or any amount in between. In some embodiments, the intermediate coating has a hardness of about 2000 HV.

In some embodiments, the second coating is configured to alter a luster thereof. In some embodiments, the luster is selected from at least one of adamantine, dull, greasy, metallic, pearly, resinous, silky, submetallic, vitreous, waxy, asterism, aventurescence, chatoyancy, or schiller.

In some embodiments, the first coating, intermediate coating, and second coating are deposited on the substrate via at least one of a multi-layer arc vapor deposition (Arc-PVD) process, an electroplating process, a physical vapor deposition (PVD) process, a chemical vapor deposition (CVD) process, a vacuum polymer deposition (VPD) process, an atomic layer deposition (ALD) process, or a high powered magnetron sputtering (HPPMS) process.

In some embodiments, the at least one of the jewelry item and the component of the jewelry item is at least one of a ring, an ornamental ring, an engagement ring, a toe ring, a watch, a watchcase, a watchband, a bracelet, a necklace, a pendant, a charm, an armlet, a brocade, a pin, a clip, a hairclip, a fob, an ornamental piercing, an earring, a nose ring, a dog tag, an amulet, a bangle bracelet, a cuff bracelet, a link bracelet, a cuff link, a key chain, a money clip, a cell phone charm, a signet ring, a class ring, a friendship ring, a purity ring, or a component of at least one thereof.

In some embodiments, the second coating has a smooth surface.

In some embodiments, the second surface has a low friction coefficient.

In some embodiments, the substrate is at least one selected from tungsten carbide, tantalum carbide, titanium carbide, hafnium carbide, vanadium carbide, molybdenum carbide, zirconium carbide, chromium carbide, or niobium carbide.

Another exemplary embodiment is directed to a method for making a jewelry ring comprising a substrate, a first coating, an intermediate coating, and a second coating, as described herein, is additionally provided. The method comprises cutting, pressing, molding, casting, striking, extruding, sintering and/or shaping the substrate into a ring shape; depositing the first coating onto the substrate; depositing the intermediate coating on the first coating, and depositing the external, second coating onto the intermediate coating.

Various alternatives of the embodiments of the invention described herein may be employed in practicing the invention.

BRIEF DESCRIPTION OF THE DRAWINGS

FIG. 1A and FIG. 1B are Minolta color spectrometer readings for traditional black PVD, and a visual representation of the LAB CIE color scale, respectively.

DETAILED DESCRIPTION

Figure 2:
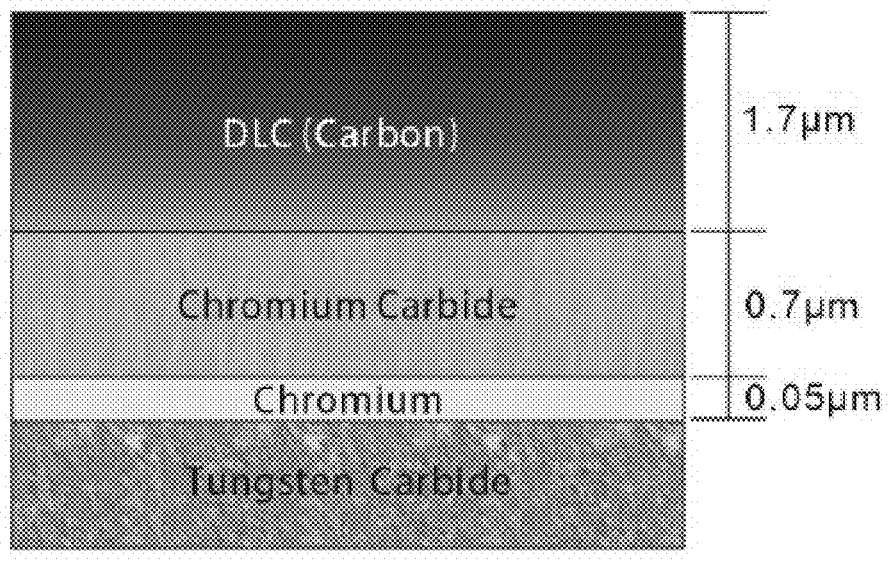
FIG. 2 illustrates a cross-section of a multi-layer coated jewelry article in accordance with an illustrative embodiment.

Advantages and features of the present disclosure, and methods for accomplishing the same will be more clearly understood from exemplary embodiments described below with reference to the accompanying drawings. However, the present disclosure is not limited to the following exemplary embodiments and may be implemented in various forms. The exemplary embodiments are provided only to complete the present disclosure and to fully provide a person having ordinary skill in the art to which the present disclosure pertains with the category of the invention, and the present disclosure will be defined by any appended claims and combinations thereof.

Shapes, sizes, ratios, angles, numbers, and the like shown in the accompanying drawings are merely exemplary, and the present disclosure is not limited thereto. Like reference numerals generally denote like elements throughout the present specification. Further, in the following description, a detailed explanation of well-known related technologies may be omitted to avoid unnecessarily obscuring the subject matter of the present disclosure. Terms such as "including," "having," and "consisting of" used herein are generally intended to allow other components to be included unless the terms are used in conjunction with the term "only." Any references to the singular may include the plural unless expressly stated otherwise.

Components are interpreted to include an ordinary error range even if not expressly stated.

The term "about" includes the referenced numeric indication ±10% of that referenced numeric indication.

As used herein, the singular forms "a," "an" and "the" are intended to include the plural forms as well, unless the context clearly indicates otherwise. Additionally, the use of "or" is intended to include "and/or," unless the context clearly indicates otherwise.

When the positional relation between two parts is described using the terms such as "on," "above," "below," and "next," one or more parts may be positioned between the two parts unless the terms are used in conjunction with the term "immediately" or "directly."

When an element or layer or coating is referred to as being "on" another element or layer or coating, the element or layer or coating may be directly on the other element or layer or coating, or intervening elements or layers or coatings may be present.

Although the terms "first," "second," and the like are used for describing various components, these components are not confined by these terms. These terms are merely used for distinguishing one component from the other components, and a first component may be a second component in a technical concept of the present disclosure.

The size and thickness of each component illustrated in the drawings are represented for convenience of explanation, and the drawings are not necessarily to scale.

As used herein, the term "electroplating" refers to the process of moving metal ions in solution via an electrical or conductive field to coat an object. This process is used for the deposition of a material, such as a metal or metal alloy, for imparting a desirable property onto the object, including but not limited to resistance to scratching, corrosivity, chipping and dulling.

As used herein, the term "jewelry" refers to personal adornments worn for ornament or utility. Jewelry includes but is in no way limited to rings, ornamental rings, engagement rings, toe rings, watches, watchcases, bracelets, necklaces, chains, pendants, charms, armlets, brocades, pins, clips, hairclips, carved beads, fobs, ornamental piercings, earrings, nose rings, body jewelry, dog tags, amulets, bangle bracelets, cuff bracelets, link bracelets, cuff links, tie clips, tie pins, tie tacks, key chains, money clips, cell phone charms, cutlery, writing utensils, pens, charms, signet rings, class rings, friendship rings or purity rings.

As used herein, the term "layering" refers to a process wherein a composition, advantageously a metallic composition, is applied to a substrate optionally comprising zero, one, or more layered composition(s). In some embodiments, layering is performed using a machine or instrument capable of performing a vapor deposition or electroplating process.

As used herein, the term "luster" refers to the way light interacts with the surface and visual appearance of a substance. In some embodiments, the substance is a jewelry article. In some embodiments, the substance is a metallic substance that is optionally capable of being manipulated.

As used herein, a substance that is "manipulable" is one capable of being patterned, surface modulated, etched, carved, faceted, cut, pressed, molded, cast, stricken, extruded, inlayed, shaped, polished, grinded, scraped, rubbed, sanded, buffed and/or filed. In some embodiments, the substance is a substrate for use in the present invention.

As used herein, the term "metal alloy" refers to a mixture of one or more metals or of substances with metallic properties. In some embodiments, metal alloys for use in the present disclosure comprise at least one transition metal including but in no way limited to tungsten, cobalt, tungsten, titanium, zirconium, tantalum, aluminum, rhodium, gold, silver, platinum, palladium, iridium, iron, stainless steel, austenitic general purpose stainless steel (Type 102), austenitic chromium-nickel-manganese alloys (200 Series stainless steel), austenitic chromium-nickel alloys (300 Series stainless steel), ferritic and martensitic chromium alloys (400 Series stainless steel), heat-resisting chromium alloys (500 Series stainless steel), nickel, niobium, vanadium, ruthenium, copper, zinc, tin, molybdenum, hafnium and rhenium. In some embodiments, the metal alloy is selected from a gold alloy, silver alloy, platinum alloy, palladium alloy and iron alloy. In some embodiments, a stainless steel alloy is selected from types 18-8, 304, 316, and 904L.

As used herein, a "metal carbide" is a compound comprising at least one transition metal or substance with metallic properties and carbon or a carbon containing chemical group. In some embodiments, metal carbides for use in the present disclosure include but are in no way limited to tungsten carbide, tungsten-copper carbide, tungsten-silver-copper carbide, titanium carbide, zirconium carbide, niobium carbide, hafnium carbide, vanadium carbide, tantalum carbide, chromium carbide, aluminum carbide or molybdenum carbide.

As used herein, a "metal nitride" is a compound comprising at least one transition metal or substance with metallic properties and nitrogen or nitrogen containing chemical group. In some embodiments, metal nitrides for use in the present disclosure include but are in no way limited to titanium nitride, chromium nitride, zirconium nitride, tungsten nitride, gold nitride, silver nitride, aluminum nitride, vanadium nitride, tantalum nitride, aluminum-titanium-nitride, titanium-aluminum-nitride or titanium-carbon-nitride.

As used herein, the term "polishing" refers to the process of smoothing and/or increasing the luster of a surface by the application of physical or chemical action or agent to a substance.

As used herein, "vapor deposition" refers to a general process for the deposition of compounds onto a designated substrate. In some embodiments, the use of vapor deposition in the context of the present disclosure refers to chemical vapor deposition (CVD), physical vapor deposition (PVD), plasma enhanced chemical vapor deposition (PECVD), diamond CVD coating, ionized physical vapor deposition (IPVD), sputtering or thermal evaporation. In some embodiments, vapor deposition is optionally used to add a first and/or a second layer or coating to a substrate used to produce a jewelry article. In some embodiments, the first and/or second layer or coating comprises a metal coating comprising one or more of tungsten, cobalt, tungsten, titanium, zirconium, tantalum, aluminum, rhodium, gold, silver, platinum, palladium, iridium, iron, stainless steel, austenitic general purpose stainless steel (Type 102), austenitic chromium-nickel-manganese alloys (200 Series stainless steel), austenitic chromium-nickel alloys (300 Series stainless steel), ferritic and martensitic chromium alloys (400 Series stainless steel), heat-resisting chromium alloys (500 Series stainless steel), nickel, niobium, vanadium, ruthenium, copper, zinc, tin, hafnium, molybdenum or rhenium. In some embodiments, the metal alloy is selected from a gold alloy, silver alloy, platinum alloy, palladium alloy or iron alloy. In some embodiments, a stainless steel alloy is selected from types 18-8, 304, 316 and 904L.

The features of various embodiments of the present disclosure can be partially or entirely bonded to or combined with each other and can be interlocked and operated in various technical ways, and the embodiments can be carried out independently of, or in association with, each other.

Hereinafter, various exemplary embodiments of the present disclosure will be described in detail with reference to the accompanying drawings.

As described in the present application, a substrate article can be provided with excellent adhesive properties when a thin first layer or coating of elemental metal is deposited on a substrate, followed by the deposition of an intermediate coating, and an outermost, second coating, which comprises a hard material, such as diamond like carbon (DLC). The outermost, second coating, has an extremely smooth surface and low friction coefficient, which promotes the avoidance of galling and spalling of the deposition, thereby extending the wear life of the coated product.

In a method for making a jewelry ring, according to the present disclosure, the cutting, pressing, molding, casting, striking, extruding, sintering and/or shaping of the substrate can utilize any process known in the art, for example using a vacuum arc furnace, plasma hearth melting, induction skull melting, free smithing, wire electric discharge machining (EDM), sink EDM, CNC lathe, and/or any polishing or engraving method known. Heat treatments may also be performed to impart desired characteristics to the ring.

In various embodiments, the first coating is deposited onto the substrate by physical vapor deposition or chemical vapor deposition. In additional embodiments, the external metallic coating is deposited onto the first coating using any known deposition technique, such as, for example, vapor deposition, PVD or CVD. Where a hard surface is desired, for example for an article that is subject to extensive wear, such as a portion of a picture frame, a paperweight, or a portion of a piece of furniture (e.g., an inlay) that may be abraded during use, this process provides a surface that is resistant to deformation and wear.

In an exemplary embodiment, the first coating is chromium, and the first coating is prepared using PVD. The formation of the chromium coating is followed by the introduction of carbon in the PVD chamber to begin to build a very durable and scratch resistant intermediary carbide layer or coating finishing with an outer layer or coating of pure carbon (Diamond Like Carbon). The arrangement of the various layers or coatings according to an exemplary embodiment is illustrated in FIG. 2. Each of the layers illustrated in FIG. 2 is optimized for their specific functions. For example, the first and second layers may be optimized to enhance their role in relaxing the hardness of the outer layer to avoid spalling and delamination.

The present disclosure describes jewelry articles and coated components of jewelry articles as well as methods for producing the same. The articles and components produced in the context of the present disclosure advantageously comprise at least two coatings or at least three coatings, wherein at least one of the coatings comprise a metal, metal alloy, metalloid or compound exhibiting metallic or metalloid-like properties. In some embodiments, the first layer or coating comprises a metal, metal alloy, metalloid or compound exhibiting metallic or metalloid-like properties. In some embodiments, the first layer or coating and second layer or coating each comprises a metal, metal alloy, metalloid or compound exhibiting metallic or metalloid-like properties. In some embodiments, the first coating decreases the deformation and/or physical degradation of the jewelry article and/or coated component of a jewelry article. In some embodiment, the first layer or coating also provides excellent adhesive properties to facilitate the attachment of the second coating to the substrate. In some embodiments, the second coating advantageously increases the robustness, hardness and sustainability of the jewelry article and/or coated component of a jewelry article. In the context of the present invention, it is intended that the "hardness" of the jewelry article and/or coated component of a jewelry article may be determined using a standard measure for hardness, including but not limited to the Mohs scale of hardness. See, e.g. Gupta, *Chemical Metallurgy: Principles and Practice*, Wiley-VCH, 2003. The DLC contributes to the black color of the outermost layer of the multi-layer coating described herein. The carbon/hydrogen deposition process may be optimized by controlling the amperage and gas flow to the PVD process to enhance the deposition of the DLC layer, and the black color thereof.

Figure 3:
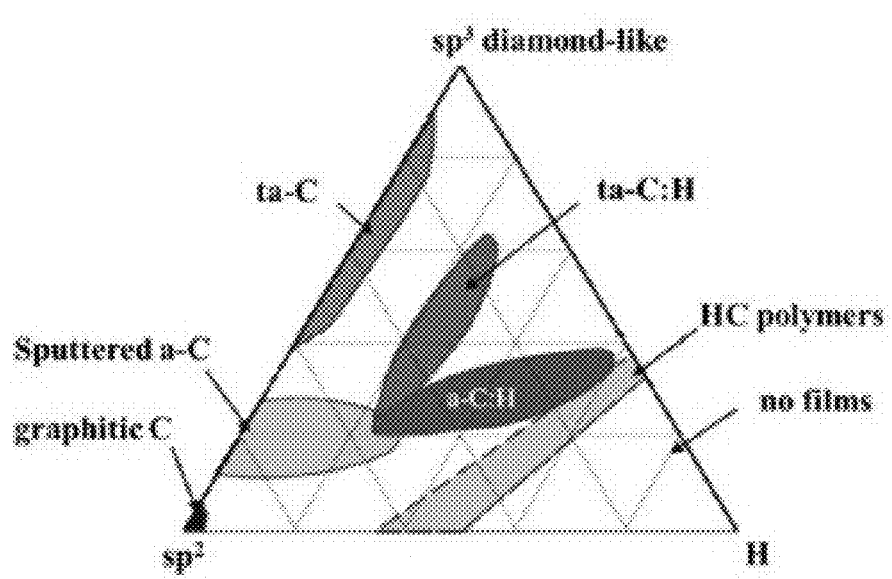
FIG. 3 is a schematic of the orbital hybridization of diamond-like carbon (DLC).

Carbon based deposits possess unique and adjustable combination of properties such as high hardness (H) and elastic modulus (E), wear resistance, chemical resistance and good tribological performance. Due to the ability of carbon-based thin films to hybridize into multiple stable bonding states, they have been developed to address a broad range of applications. Amorphous carbon is a disordered material, which differs from crystalline, fully bonded lattice structures, like sp2 and sp3. Diamond and graphite are allotropes for carbon with different arrangements of their lattice structures. Graphite crystallizes in the hexagonal system, and the weak covalent bonds allow graphite crystals to slide over one another. Diamond crystalizes in the isometric system. Hydrogenated amorphous carbon also known as diamond-like carbon (DLC) is an amorphous network composed of carbon and hydrogen. This network consists of strongly cross-linked carbon atoms with mainly sp2 (graphitic-like) and sp3 (diamond-like) bonds. The properties of these DLC films depend strongly on hydrogen content as well as the sp2/sp3 ratio which in turn depend on the deposition process and its parameters. That is, DLC has an amorphous crystalline structure containing both sp2 and sp3 bonded carbon, as illustrated in FIG. 3. In FIG. 3, C: graphitic carbon; a-C: amorphous carbon; Ta—C: tetrahedral amorphous carbon; Ta—C:H: hydrogenated tetrahedral amorphous carbon; H: hydrogen; and HC: Polymers: hydrocarbons. DLC can be made so that it is simultaneously amorphous, flexible and yet purely sp3 bonded (like diamond). Orbital hybridization is the concept of mixing atomic orbitals into new hybrid orbitals with different properties, such as energy, shape, and the like.

The multi-layer coating described herein is applied by cathodic arc or Arc-PVD, which is a physical vapor deposition technique in which an electric arc under a vacuum and noble cover gas is used to vaporize material from a cathode target (donor). Reactive gases are introduced into the chamber during the process which combine with the donor material to create compounds like carbides, nitrides and hydrides. The vaporized material then condenses on a substrate, in this case, tungsten carbide, but is not limited to WC. Alternate methods of deposition include Chemical vapor deposition (CVD), vacuum polymer deposition (VPD), atomic layer deposition (ALD), high powered magnetron sputtering (HPPMS).

The durability and longevity of thin films and deposits above 1 μm are largely dependent upon their adhesion to the substrate since this determines the ease of removal. Proper substrate preparation and sequence of cleaning processes are crucial factors for the enhancement of adhesion strength. Another key factor which determines good adhesion is the microhardness of the deposit. For example, elemental titanium and titanium carbide are good alternatives for chromium used in an exemplary embodiment as the first coating, but a TiC coating is extremely hard, having a hardness value of 4500 HV, which renders the coating brittle and susceptible to spalling. Chromium and chromium carbide coatings, on the other hand, remain in the range of about HV 2000 to about 2800 HV, which has the benefit of elastic and plastic deformation of the film and substrate. Such chromium and/or chromium carbide coatings may preferably have a hardness value of about 2000 HV.

Surface roughness also plays an important role in how an object interacts with its environment. Careful design consideration is required to overcome the risk of failure arising from excessive friction and wear. Friction is the resistance to the sliding of a solid when the resistance is produced by a contacting body. Low friction is required in products designed to move continuously like engines, skis and the internal mechanism of watches.

Wear is the removal of material from a solid surface because of mechanical action exerted on it by another solid. Wear occurs as a progressive loss of material resulting from the mechanical interaction of two sliding surfaces under a given load. In the study of tribology, objects with rough surfaces have a higher propensity to wear than those with smoother surfaces.

Tribology is the study of lubrication and wear systems, and is a complex interdisciplinary subject involving the science and engineering of the interaction of sliding surfaces. Tribology includes three subjects: friction, wear and lubrication. Lubricity is the measure of the reduction in friction or wear by a lubricant. Lubricity is often measured by determining how much wear is caused to a surface by a given wear-inducing object during a given amount of time. Friction forces are categorized into two types static friction and dynamic friction. Various techniques can be employed in tribological testing/analysis, including but not limited to, taber testing for abrasion resistance to prove the superior wear resistance of a coating process, an adhesion test using a pin-on-disk apparatus (ASTM-G99), a friction test using a ball-on-disk apparatus (ASTM A1894), a microhardness test (ASTM X), and color spectroscopy for measuring a color value.

In some embodiments, where the intermediate coating comprises TiC, $Cr_3C_2$, ZrC, HfC, VC, NbC, WC, or TaC, the first coating comprises at least one of chromium (Cr), molybdenum (Mo), tungsten (W), seaborgium (Sg), titanium (Ti), vanadium (V), manganese (Mn), iron (Fe), cobalt (Co), nickel (Ni), copper (Cu), zirconium (Zr), niobium (Nb), technicium (Tc), ruthenium (Ru), rhodium (Rh), palladium (Pd), silver (Ag), mercury (Hg), tantalum (Ta), rhenium (Re), osmium (Os), iridium (Ir), platinum (Pt), gold (Au), rutherfordium (Rf), dubnium (Db), bohrium (Bh) or hassium (Hs), a combination comprising at least one thereof, or an alloy comprising at least one thereof, or any combination of the foregoing. The second layer or coating comprises at least one of diamond like carbon (DLC), titanium-carbo-nitride (TiCN), aluminum-titanium nitride (AlTiN), aluminum-titanium-silicon nitride (AlTiSiN), aluminum-chromium-silicon nitride (AlCrSiN), titanium-aluminum-chromium-silicon nitride (TiAlCrSiN), titanium aluminum nitride (TiAlN), aluminum oxi-nitride (AlNO), aluminum-titanium-silicon nitride nitride (AlTiCrN), titanium carbide (TiC), tantalum carbide (TaC), hafnium carbide (HfC), tungsten carbide (WC), a combination comprising at least one thereof, an alloy comprising at least one thereof, or any combination of the foregoing.

In some embodiments, where the substrate comprises copper or a copper alloy, the first coating comprises at least one of chromium (Cr), molybdenum (Mo), tungsten (W), seaborgium (Sg), titanium (Ti), vanadium (V), manganese (Mn), iron (Fe), cobalt (Co), zirconium (Zr), niobium (Nb), technicium (Tc), ruthenium (Ru), rhodium (Rh), silver (Ag), mercury (Hg), tantalum (Ta), rhenium (Re), osmium (Os), iridium (Ir), platinum (Pt), gold (Au), rutherfordium (Rf), dubnium (Db), bohrium (Bh) or hassium (Hs), a combination comprising at least one thereof, or an alloy comprising at least one thereof, or any combination of the foregoing. The intermediate coating comprises at least one of chromium carbide ($Cr_3C_2$), zirconium nitride (ZrN), chromium-titanium nitride (CrTiN), titanium-aluminum nitride (TiAlN), aluminum-titanium nitride (AlTiN), aluminum-oxi-nitride (AlNO), aluminum-titanium-chromium nitride (AlTiCrN), tungsten nitride (WN), tungsten carbide (WC), titanium diboride ($TiB_2$), aluminum oxide (AlO), Boron carbide (BC), boron nitride (BN), silicon carbide (SiC), silicon nitride (SiN), tungsten (W), zirconium (Zr), cobalt chrome, cobalt chromium, nitinol, aluminum (Al), aluminum carbide, vanadium (V), copper (Cu), brass, bronze, tungsten copper, zinc (Zn), tin (Sn), German silver, niobium (Nb), molybdenum (Mo), hafnium (Hf), rhenium (Re), chromium (Cr), a steel alloy, silver nitride, aluminum nitride, vanadium nitride, tantalum nitride, chromium carbide, zirconium carbide, tantalum carbide, cobalt chrome molybdenum, a combination comprising at least one thereof, an alloy comprising at least one thereof, or a combination of any of the foregoing. The second coating comprises at least one of diamond like carbon (DLC), titanium-carbo-nitride (TiCN), aluminum-titanium nitride (AlTiN), aluminum-titanium-silicon nitride (AlTiSiN), aluminum-chromium-silicon nitride (AlCrSiN), titanium-aluminum-chromium-silicon nitride (TiAlCrSiN), titanium aluminum nitride (TiAlN), aluminum oxi-nitride (AlNO), aluminum-titanium-silicon nitride nitride (AlTiCrN), titanium carbide (TiC), tantalum carbide (TaC), hafnium carbide (HfC), tungsten carbide (WC), a combination comprising at least one thereof, an alloy comprising at least one thereof, or any combination of the foregoing.

In some embodiments, the intermediate coating does not include a silicon gold compound.

In some embodiments, the intermediate coating does not include a silicon gold germanium compound.

In some embodiments, the outermost coating does not include platinum, palladium, rhodium, or an alloy of any of the foregoing.

In some embodiments, the first coating does not include a DLC silicon compound.

In some embodiments, the outermost coating does not include a DLC silicon compound.

In some embodiments, the outermost coating does not include a DLC carbon-based compound, a DLC hydrogen compound, or a DLC nitrogen compound.

In some embodiments, the first coating is excluded, to provide a two layer or coating apparatus.

In some embodiments, the intermediary coating is excluded, to provide a two layer or coating apparatus.

Although the exemplary embodiments of the present disclosure have been described in detail with reference to the accompanying drawing and examples, the present disclosure is not limited thereto and may be embodied in many different forms without departing from the technical concept of the present disclosure. Therefore, the exemplary embodiments of the present disclosure are provided for illustrative purposes only and are not intended to limit the technical concept of the present disclosure. The protective scope of the present disclosure should be construed based on any appended claims and combinations thereof, and all the technical concepts in the equivalent scope thereof should be construed as falling within the scope of the present disclosure. As various changes could be made in the above methods and compositions without departing from the scope of the invention, it is intended that all matter contained in the above description shall be interpreted as illustrative and not in a limiting sense. Other embodiments within the scope of the claims herein will be apparent to one skilled in the art from consideration of the specification or practice of the invention as disclosed herein. It is intended that the specification be considered exemplary only, with the scope and spirit of the invention being indicated by the claims.

The invention claimed is:

1. A device comprising:
   a substrate;
   a first coating deposited on the substrate;
   an intermediate coating deposited on the first coating, wherein the first coating is interposed between the substrate and the intermediate coating;
   a second coating deposited on the intermediate coating, wherein the intermediate coating is interposed between the first coating and the second coating, and the second coating is outermost,
   wherein the substrate, the first coating, the intermediate coating and the second coating define at least one of a jewelry item or a component of a jewelry item,
   wherein the substrate comprises at least one of tungsten carbide, cobalt, tungsten, titanium, titanium carbide, zirconium, zirconium carbide, tantalum, tantalum carbide, rhodium, gold, silver, platinum, palladium, iridium, iron, stainless steel, cobalt chrome, nickel, nitinol, aluminum, aluminum carbide, vanadium, ruthenium, copper, tungsten copper, brass, bronze, zinc, tin, niobium, molybdenum, molybdenum carbide, rhenium, hafnium, hafnium carbide, vanadium, vanadium carbide, chromium, chromium carbide, niobium, niobium carbide, a combination comprising at least one thereof, and an alloy comprising at least one thereof,
   wherein the first coating comprises at least one of chromium (Cr), molybdenum (Mo), tungsten (W), seaborgium (Sg), vanadium (V), manganese (Mn), iron (Fe), cobalt (Co), nickel (Ni), copper (Cu), zirconium (Zr), niobium (Nb), technicium (Tc), ruthenium (Ru), rhodium (Rh), palladium (Pd), silver (Ag), mercury (Hg), tantalum (Ta), rhenium (Re), osmium (Os), iridium (Ir), platinum (Pt), gold (Au), rutherfordium (Rf), dubnium (Db), bohrium (Bh) or hassium (Hs), a combination comprising at least one thereof, or an alloy comprising at least one thereof, or any combination of the foregoing, wherein the intermediate coating comprises at least one of chromium carbide (Cr$_3$C$_2$), zirconium nitride (ZrN), chromium-titanium nitride (CrTiN), titanium aluminum nitride (TiAlN), aluminum-titanium nitride (AlTiN), aluminum oxi-nitride (AlNO), aluminum-titanium-chromium nitride (AlTiCrN), tungsten nitride (WN), tungsten carbide (WC), titanium diboride (TiB$_2$), aluminum oxide (AlO), Boron carbide (BC), boron nitride (BN), silicon carbide (SiC), silicon nitride (SiN), tungsten (W), zirconium (Zr), cobalt chrome, cobalt chromium, nitinol, aluminum (Al), aluminum carbide, vanadium (V), copper (Cu), brass, bronze, tungsten copper, zinc (Zn), tin (Sn), German silver, niobium (Nb), molybdenum (Mo), hafnium (Hf), rhenium (Re), chromium (Cr), a steel alloy, silver nitride, aluminum nitride, vanadium nitride, tantalum nitride, zirconium carbide, tantalum carbide, cobalt chrome molybdenum, a combination comprising at least one thereof, an alloy comprising at least one thereof, or a combination of any of the foregoing, wherein the second coating comprises at least one of diamond like carbon (DLC), titanium-carbo-nitride (TiCN), aluminum-titanium nitride (AlTiN), aluminum-titanium-silicon nitride (AlTiSiN), aluminum-chromium-silicon nitride (AlCrSiN), titanium-aluminum-chromium-silicon nitride (TiAlCrSiN), titanium aluminum nitride (TiAlN), aluminum oxi-nitride (AlNO), aluminum-titanium-silicon nitride nitride (AlTiCrN), titanium carbide (TiC), tantalum carbide (TaC), hafnium carbide (HfC), tungsten carbide (WC), a combination comprising at least one thereof, an alloy comprising at least one thereof, or any combination of the foregoing, and wherein the second coating is black.

2. The device of claim 1, wherein the second coating is diamond like carbon.

3. The device of claim 1, wherein a thickness of the second coating is from about 0.01 µm to about 60 µm.

4. The device of claim 3, wherein the second coating has a thickness of about 55.5 µm.

5. The device of claim 3, wherein the second coating has a thickness of about 1.7 µm.

6. The device of claim 1, wherein the first coating is chromium.

7. The device of claim 6, wherein a thickness of the first coating is from about 0.01 to about 3.0 µm.

8. The device of claim 7, wherein the thickness of the first coating is about 1.6 µm.

9. The device of claim 8, wherein the thickness of the first coating is about 0.05 µm.

10. The device of claim 1, wherein the intermediate coating is chromium carbide.

11. The device of claim 1, wherein a thickness of the intermediate coating is from about 0.01 µm to about 30.0 µm.

12. The device of claim 11, wherein the thickness of the intermediate coating is about 29.9 µm.

13. The device of claim 11, wherein the thickness of the intermediate coating is about 1.7 µm.

14. The device of claim 1, wherein a total thickness of the first coating, the intermediate coating and the second coating is from about 2.0 µm to about 80 µm.

15. The device of claim 14, wherein the total thickness of the first coating, the intermediate coating and the second coating is about 2.45 µm.

16. The device of claim 14, wherein the total thickness of the first coating, the intermediate coating and the second coating is about 80 µm.

17. The device of claim 6, wherein the first coating has a hardness of about 2000 to about 2800 HV.

18. The device of claim 10, wherein the intermediate coating has a hardness of about 2000 to about 2800 HV.

19. The device of claim 2, wherein the second coating has a hardness of about 2000 to about 2800 HV.

20. The device of claim 1, wherein the second coating is configured to alter a luster thereof.

21. The device of claim 20, wherein the luster is selected from at least one of adamantine, dull, greasy, metallic, pearly, resinous, silky, submetallic, vitreous, waxy, asterism, aventurescence, chatoyancy, and schiller.

22. The device of claim 1, wherein the first coating, intermediate coating, and second coating are deposited on the substrate via at least one of an electroplating process, a physical vapor deposition (PVD) process, a chemical vapor deposition (CVD) process, a vacuum polymer deposition (VPD) process, or an atomic layer deposition (ALD) process.

23. The device of claim 1, wherein the at least one of the jewelry item and the component of the jewelry item is at least one of a ring, a watch, a watchcase, a watchband, a bracelet, a necklace, a pendant, a charm, an armlet, a brocade, a pin, a clip, a fob, an ornamental piercing, an earring, a dog tag, an amulet, a cuff link, a key chain, a cell phone charm, or a component of at least one thereof.

24. The device of claim 1, wherein the second coating has a smooth surface.

25. The device of claim 1, wherein the second surface has a low friction coefficient.

26. The device of claim 1, wherein the substrate is at least one selected from tungsten carbide, tantalum carbide, titanium carbide, hafnium carbide, vanadium carbide, molybdenum carbide, zirconium carbide, chromium carbide, and niobium carbide.

27. The device of claim 1, wherein the intermediate coating does not include a silicon gold compound.

28. The device of claim 1, wherein the intermediate coating does not include a silicon gold germanium compound.

29. The device of claim 1, wherein the outermost coating does not include platinum, palladium, rhodium, or an alloy of any of the foregoing.

30. The device of claim 1, wherein the first coating does not include a DLC silicon compound.

31. The device of claim 1, wherein the outermost coating does not include a DLC silicon compound.

32. The device of claim 1, wherein the outermost coating does not include a DLC-based carbon compound, a DLC hydrogen compound, or a DLC nitrogen compound.

33. A device, comprising:
a substrate;
a first coating deposited on the substrate;
an intermediate coating deposited on the first coating, wherein the first coating is interposed between the substrate and the intermediate coating;
a second coating deposited on the intermediate coating, wherein the intermediate coating is interposed between the first coating and the second coating, and the second coating is outermost, wherein the substrate, the first coating, the intermediate coating and the second coating define at least one of a jewelry item or a component of a jewelry item,
wherein the substrate comprises at least one of tungsten carbide, cobalt, tungsten, titanium, titanium carbide, zirconium, zirconium carbide, tantalum, tantalum carbide, rhodium, gold, silver, platinum, palladium, iridium, iron, stainless steel, austenitic general purpose stainless steel (Type 102), austenitic chromium-nickel-manganese alloys (200 Series stainless steel), austenitic chromium-nickel alloys (300 Series stainless steel), ferritic and martensitic chromium alloys (400 Series stainless steel), heat-resisting chromium alloys (500 Series stainless steel), cobalt chrome, cobalt chromium, nickel, nitinol, aluminum, aluminum carbide, vanadium, ruthenium, copper, tungsten copper, brass, bronze, zinc, tin, German silver, niobium, molybdenum, molybdenum carbide, rhenium, hafnium, hafnium carbide, vanadium, vanadium carbide, chromium, chromium carbide, niobium, niobium carbide, a combination comprising at least one thereof, and an alloy comprising at least one thereof,
wherein the intermediate coating comprises TiC, $Cr_3C_2$, ZrC, HfC, VC, NbC, WC, or TaC,
wherein the first coating comprises at least one of chromium (Cr), molybdenum (Mo), tungsten (W), seaborgium (Sg), vanadium (V), manganese (Mn), iron (Fe), cobalt (Co), nickel (Ni), copper (Cu), zirconium (Zr), niobium (Nb), technicium (Tc), ruthenium (Ru), rhodium (Rh), palladium (Pd), silver (Ag), mercury (Hg), tantalum (Ta), rhenium (Re), osmium (Os), iridium (Ir), platinum (Pt), gold (Au), rutherfordium (Rf), dubnium (Db), bohrium (Bh) or hassium (Hs), a combination comprising at least one thereof, or an alloy comprising at least one thereof, or any combination of the foregoing, and
wherein the second coating comprises at least one of diamond like carbon (DLC), titanium-carbo-nitride (TiCN), aluminum-titanium nitride (AlTiN), aluminum-titanium-silicon nitride (AlTiSiN), aluminum-chromium-silicon nitride (AlCrSiN), titanium-aluminum-chromium-silicon nitride (TiAlCrSiN), titanium aluminum nitride (TiAlN), aluminum oxi-nitride (AlNO), aluminum-titanium-silicon nitride nitride (AlTiCrN), titanium carbide (TiC), tantalum carbide (TaC), hafnium carbide (HfC), tungsten carbide (WC), a combination comprising at least one thereof, an alloy comprising at least one thereof, or any combination of the foregoing.

34. A device, comprising:
a substrate;
a first coating deposited on the substrate;
an intermediate coating deposited on the first coating, wherein the first coating is interposed between the substrate and the intermediate coating;
a second coating deposited on the intermediate coating, wherein the intermediate coating is interposed between the first coating and the second coating, and the second coating is outermost,
wherein the substrate, the first coating, the intermediate coating and the second coating define at least one of a jewelry item or a component of a jewelry item, wherein the substrate comprises at least one of copper or a copper alloy,
wherein the first coating comprises at least one of chromium (Cr), molybdenum (Mo), tungsten (W), seaborgium (Sg), vanadium (V), manganese (Mn), iron (Fe), cobalt (Co), zirconium (Zr), niobium (Nb), technicium (Tc), ruthenium (Ru), rhodium (Rh), silver (Ag), mercury (Hg), tantalum (Ta), rhenium (Re), osmium (Os), iridium (Ir), platinum (Pt), gold (Au), rutherfordium (Rf), dubnium (Db), bohrium (Bh) or hassium (Hs), a combination comprising at least one thereof, or an alloy comprising at least one thereof, or any combination of the foregoing,
wherein the intermediate coating comprises at least one of chromium carbide ($Cr_3C_2$), zirconium nitride (ZrN), chromium-titanium nitride (CrTiN), titanium-aluminum nitride (TiAlN), aluminum-titanium nitride (AlTiN), aluminum-oxi-nitride (AlNO), aluminum-titanium-chromium nitride (AlTiCrN), tungsten nitride (WN), tungsten carbide (WC), titanium diboride ($TiB_2$), aluminum oxide (AlO), Boron carbide (BC), boron nitride (BN), silicon carbide (SiC), silicon nitride (SiN), tungsten (W), zirconium (Zr), cobalt chrome, nitinol, aluminum (Al), aluminum carbide, vanadium (V), copper (Cu), brass, bronze, tungsten copper, zinc (Zn), tin (Sn), German silver, niobium (Nb), molybdenum (Mo), hafnium (Hf), rhenium (Re), chromium (Cr), a steel alloy, silver nitride, aluminum nitride, vanadium nitride, tantalum nitride, zirconium carbide, tantalum carbide, cobalt chrome molybdenum, a combination comprising at least one thereof, an alloy comprising at least one thereof, or a combination of any of the foregoing, and
wherein the second coating comprises at least one of diamond like carbon (DLC), titanium-carbo-nitride (TiCN), aluminum-titanium nitride (AlTiN), aluminum-titanium-silicon nitride (AlTiSiN), aluminum-chromium-silicon nitride (AlCrSiN), titanium-aluminum-chromium-silicon nitride (TiAlCrSiN), titanium aluminum nitride (TiAlN), aluminum oxi-nitride (AlNO), aluminum-titanium-silicon nitride nitride (AlTiCrN), titanium carbide (TiC), tantalum carbide (TaC), hafnium carbide (HfC), tungsten carbide (WC), a combination comprising at least one thereof, an alloy comprising at least one thereof, or any combination of the foregoing.

35. The device of claim 1, wherein the stainless steel is at least one of austenitic general purpose stainless steel (Type 102), austenitic chromium-nickel-manganese alloys (200 Series stainless steel), austenitic chromium-nickel alloys (300 Series stainless steel), ferritic and martensitic chromium alloys (400 Series stainless steel), or heat-resisting chromium alloys (500 Series stainless steel).

36. The device of claim 1, wherein the silver is German silver.

37. The device of claim 1, wherein the cobalt chrome is cobalt chromium.

38. The device of claim 22, wherein the physical vapor deposition (PVD) process is at least one of a multi-layer arc vapor deposition (Arc-PVD) process or a high powered magnetron sputtering (HPPMS) process.

39. The device of claim 23, wherein the ring is at least one of an ornamental ring, an engagement ring, a toe ring, a nose ring, a signet ring, a class ring, a friendship ring, or a purity ring.

40. The device of claim 23, wherein the clip is at least one of a hairclip or a money clip.

41. The device of claim 23, wherein the bracelet is at least one of a bangle bracelet, a cuff bracelet, or a link bracelet.

42. A device comprising:
a substrate;
a first coating deposited on the substrate;

an intermediate coating deposited on the first coating, wherein the first coating is interposed between the substrate and the intermediate coating;
a second coating deposited on the intermediate coating, wherein the intermediate coating is interposed between the first coating and the second coating, and the second coating is outermost,
wherein the substrate, the first coating, the intermediate coating and the second coating define at least one of a jewelry item or a component of a jewelry item,
wherein the substrate comprises at least one of tungsten carbide, cobalt, tungsten, titanium, titanium carbide, zirconium, zirconium carbide, tantalum, tantalum carbide, rhodium, gold, silver, platinum, palladium, iridium, iron, stainless steel, cobalt chrome, nickel, nitinol, aluminum, aluminum carbide, vanadium, ruthenium, copper, tungsten copper, brass, bronze, zinc, tin, niobium, molybdenum, molybdenum carbide, rhenium, hafnium, hafnium carbide, vanadium, vanadium carbide, chromium, chromium carbide, niobium, niobium carbide, a combination comprising at least one thereof, and an alloy comprising at least one thereof,
wherein the first coating comprises at least one of chromium (Cr), molybdenum (Mo), tungsten (W), seaborgium (Sg), titanium (Ti), vanadium (V), manganese (Mn), iron (Fe), cobalt (Co), nickel (Ni), copper (Cu), zirconium (Zr), niobium (Nb), technicium (Tc), ruthenium (Ru), rhodium (Rh), palladium (Pd), silver (Ag), mercury (Hg), tantalum (Ta), rhenium (Re), osmium (Os), iridium (Ir), platinum (Pt), gold (Au), rutherfordium (Rf), dubnium (Db), bohrium (Bh) or hassium (Hs), a combination comprising at least one thereof, or an alloy comprising at least one thereof, or any combination of the foregoing,
wherein the intermediate coating comprises at least one of chromium carbide ($Cr_3C_2$), zirconium nitride (ZrN), chromium-titanium nitride (CrTiN), titanium aluminum nitride (TiAlN), aluminum-titanium nitride (AlTiN), aluminum oxi-nitride (AlNO), aluminum-titanium-chromium nitride (AlTiCrN), tungsten nitride (WN), titanium diboride ($TiB_2$), aluminum oxide (AlO), Boron carbide (BC), boron nitride (BN), silicon nitride (SiN), zirconium (Zr), cobalt chrome, cobalt chromium, nitinol, aluminum (Al), aluminum carbide, vanadium (V), copper (Cu), brass, bronze, tungsten copper, zinc (Zn), tin (Sn), German silver, niobium (Nb), molybdenum (Mo), hafnium (Hf), rhenium (Re), chromium (Cr), a steel alloy, silver nitride, aluminum nitride, vanadium nitride, tantalum nitride, zirconium carbide, tantalum carbide, cobalt chrome molybdenum, a combination comprising at least one thereof, an alloy comprising at least one thereof, or a combination of any of the foregoing, and
wherein the second coating comprises at least one of diamond like carbon (DLC), titanium-carbo-nitride (TiCN), aluminum-titanium nitride (AlTiN), aluminum-titanium-silicon nitride (AlTiSiN), aluminum-chromium-silicon nitride (AlCrSiN), titanium-aluminum-chromium-silicon nitride (TiAlCrSiN), titanium aluminum nitride (TiAlN), aluminum oxi-nitride (AlNO), aluminum-titanium-silicon nitride nitride (AlTiCrN), titanium carbide (TiC), tantalum carbide (TaC), hafnium carbide (HfC), tungsten carbide (WC), a combination comprising at least one thereof, an alloy comprising at least one thereof, or any combination of the foregoing.

43. A device, comprising:
a substrate;
a first coating deposited on the substrate;
an intermediate coating deposited on the first coating, wherein the first coating is interposed between the substrate and the intermediate coating;
a second coating deposited on the intermediate coating, wherein the intermediate coating is interposed between the first coating and the second coating, and the second coating is outermost,
wherein the substrate, the first coating, the intermediate coating and the second coating define at least one of a jewelry item or a component of a jewelry item, wherein the substrate comprises at least one of copper or a copper alloy,
wherein the first coating comprises at least one of chromium (Cr), molybdenum (Mo), tungsten (W), seaborgium (Sg), titanium (Ti), vanadium (V), manganese (Mn), iron (Fe), cobalt (Co), zirconium (Zr), niobium (Nb), technicium (Tc), ruthenium (Ru), rhodium (Rh), silver (Ag), mercury (Hg), tantalum (Ta), rhenium (Re), osmium (Os), iridium (Ir), platinum (Pt), gold (Au), rutherfordium (Rf), dubnium (Db), bohrium (Bh) or hassium (Hs), a combination comprising at least one thereof, or an alloy comprising at least one thereof, or any combination of the foregoing,
wherein the intermediate coating comprises at least one of chromium carbide ($Cr_3C_2$), zirconium nitride (ZrN), chromium-titanium nitride (CrTiN), titanium-aluminum nitride (TiAlN), aluminum-titanium nitride (AlTiN), aluminum-oxi-nitride (AlNO), aluminum-titanium-chromium nitride (AlTiCrN), tungsten nitride (WN), titanium diboride ($TiB_2$), aluminum oxide (AlO), Boron carbide (BC), boron nitride (BN), silicon nitride (SiN), zirconium (Zr), cobalt chrome, nitinol, aluminum (Al), aluminum carbide, vanadium (V), copper (Cu), brass, bronze, tungsten copper, zinc (Zn), tin (Sn), German silver, niobium (Nb), molybdenum (Mo), hafnium (Hf), rhenium (Re), chromium (Cr), a steel alloy, silver nitride, aluminum nitride, vanadium nitride, tantalum nitride, zirconium carbide, tantalum carbide, cobalt chrome molybdenum, a combination comprising at least one thereof, an alloy comprising at least one thereof, or a combination of any of the foregoing, and
wherein the second coating comprises at least one of diamond like carbon (DLC), titanium-carbo-nitride (TiCN), aluminum-titanium nitride (AlTiN), aluminum-titanium-silicon nitride (AlTiSiN), aluminum-chromium-silicon nitride (AlCrSiN), titanium-aluminum-chromium-silicon nitride (TiAlCrSiN), titanium aluminum nitride (TiAlN), aluminum oxi-nitride (AlNO), aluminum-titanium-silicon nitride nitride (AlTiCrN), titanium carbide (TiC), tantalum carbide (TaC), hafnium carbide (HfC), tungsten carbide (WC), a combination comprising at least one thereof, an alloy comprising at least one thereof, or any combination of the foregoing.

* * * * *